United States Patent
Satoh

(10) Patent No.: US 7,755,147 B2
(45) Date of Patent: Jul. 13, 2010

(54) SEMICONDUCTOR DEVICE, SEMICONDUCTOR SYSTEM AND SEMICONDUCTOR DEVICE MANUFACTURING METHOD

(75) Inventor: Shigeo Satoh, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 81 days.

(21) Appl. No.: 11/952,373

(22) Filed: Dec. 7, 2007

(65) Prior Publication Data

US 2008/0128756 A1 Jun. 5, 2008

Related U.S. Application Data

(63) Continuation of application No. PCT/JP2005/010709, filed on Jun. 10, 2005.

(51) Int. Cl.
H01L 23/48 (2006.01)
(52) U.S. Cl. .................. 257/371; 257/203; 257/374; 257/E27.065; 257/E27.067
(58) Field of Classification Search .................. 257/203, 257/371, 374, E27.065, E27.067
See application file for complete search history.

(56) References Cited

U.S. PATENT DOCUMENTS

| | | | |
|---|---|---|---|
| 5,374,569 A | 12/1994 | Yilmaz et al. | |
| 5,416,039 A | 5/1995 | Yilmaz et al. | |
| 5,422,508 A | 6/1995 | Yilmaz et al. | |
| 5,426,328 A | 6/1995 | Yilmaz et al. | |
| 5,541,123 A | 7/1996 | Williams et al. | |
| 5,541,125 A | 7/1996 | Williams et al. | |
| 5,547,880 A | 8/1996 | Williams et al. | |
| 5,559,044 A | 9/1996 | Williams et al. | |
| 5,583,061 A | 12/1996 | Williams et al. | |
| 5,618,743 A | 4/1997 | Williams et al. | |
| 5,643,820 A | 7/1997 | Williams et al. | |
| 5,648,281 A | 7/1997 | Williams et al. | |

(Continued)

FOREIGN PATENT DOCUMENTS

JP 6-216346 A 8/1994

(Continued)

OTHER PUBLICATIONS

Notification of Transmittal of Translation of the International Preliminary Report on Patentability (Form PCT/IB/338) of International Application No. PCT/JP2005/010709 mailed Dec. 27, 2007 with Forms PCT/IB/373 and PCT/ISA/237.

(Continued)

*Primary Examiner*—Tan N Tran
(74) *Attorney, Agent, or Firm*—Fujitsu Patent Center

(57) ABSTRACT

A semiconductor device is provided with a first conductivity type semiconductor substrate (10); a voltage supplying terminal (26) arranged on the semiconductors substrate (10); one or more elements (6) which include a second conductivity type well section (22) and are arranged on the semiconductor substrate (10); a second conductivity type first conductive layer (21), which is a lower layer of the one or more elements (6), is in contact with the second conductivity type well section (22), and connects the second conductivity type well section (22) of the one or more elements (6) with the voltage supplying terminal (26); and a first conductivity type second conductive layer (11) formed in contact with a lower side of the first conductive layer (21).

5 Claims, 15 Drawing Sheets

U.S. PATENT DOCUMENTS

| | | |
|---|---|---|
| 5,751,054 A | 5/1998 | Yilmaz et al. |
| 6,040,610 A | 3/2000 | Noguchi et al. |
| 6,809,336 B2 | 10/2004 | Kunikiyo et al. |
| 2004/0026743 A1 | 2/2004 | Shibata et al. |

FOREIGN PATENT DOCUMENTS

| | | | |
|---|---|---|---|
| JP | 8-227945 A | 9/1996 |
| JP | 9-223747 A | 8/1997 |
| JP | 10-340998 A | 12/1998 |
| JP | 2002-158293 A | 5/2002 |
| JP | 2003-60071 A | 2/2003 |
| JP | 2003-78032 A | 3/2003 |

OTHER PUBLICATIONS

International Search Report of PCT/JP2005/010709, date of mailing Aug. 30, 2005.

US 7,755,147 B2

SEMICONDUCTOR DEVICE, SEMICONDUCTOR SYSTEM AND SEMICONDUCTOR DEVICE MANUFACTURING METHOD

CROSS-REFERENCE TO RELATED APPLICATION

This is a continuation of Application PCT/JP2005/010709, filed on Jun. 10, 2005, now pending, the contents of which are herein wholly incorporated by reference.

BACKGROUND

1. Technical Field

The present invention related to a semiconductor device including a system LSI etc.

2. Background Arts

Known is a method of changing a well voltage of an element depending on when in a standby status and when in an active status in order to reduce power consumption of the semiconductor device such as the system LSI.

For example, in the case of a NMOS transistor, when a minus voltage is applied to a substrate, a reverse bias occurs between the substrate (p-well) and an n-type source/drain. Therefore, a depletion layer of the substrate at a lower part of a gate spreads, and, as compared with a case of having no reverse bias, an extra gate voltage is needed for inducing the same quantity of channel electric charge (electrons), resulting in a rise in threshold voltage of the NMOS transistor. As a consequence of this, an off-current flowing to between the source and the drain when the gate voltage is off, is restrained. In the case of a PMOS transistor, conversely, when a plus voltage is applied to the substrate (i.e., n-well), the off-current is similarly restrained.

An element to be driven in a way that changes a well voltage of the element depending on when in the standby status and when in the active status, will hereinafter be termed a well voltage variable element. Further, a transistor to be driven in a way that thus changes the well voltage is called a well voltage variable transistor.

Normally, the well voltage (substrate voltage) is controlled per circuit block. Namely, the well voltage is controlled by distinguishing between the standby status and the active status for every circuit block. Hence, it follows that the well voltages of a plurality of transistors are simultaneously controlled.

In the techniques described above, if the voltage supply terminal is distanced away from the well voltage variable element, influence of elements existing on the substrate surface along a route therebetween can not be ignored. Namely, the well voltages fluctuate due to changes of signals of respective components (a gate, a source, a drain, etc) of these elements. This might cause a malfunction due to a fluctuation of a characteristic of the well voltage variable element.

SUMMARY

A semiconductor device includes: a first conductivity type semiconductor substrate; a voltage supply terminal provided on the semiconductor substrate; one or more elements including a well portion of a second conductivity type different from a first conductivity type and disposed on the semiconductor substrate; a second conductivity type first conductive layer formed contiguously with the second conductivity type well portion in a lower layer under the one or more elements and connecting the second conductivity type well portion of the one or more elements to the voltage supply terminal; and a first conductivity type second conductive layer formed contiguously with the first conductive layer in a lower layer of the first conductive layer.

DETAILED DESCRIPTION

Substance of the Invention

Figure 1:
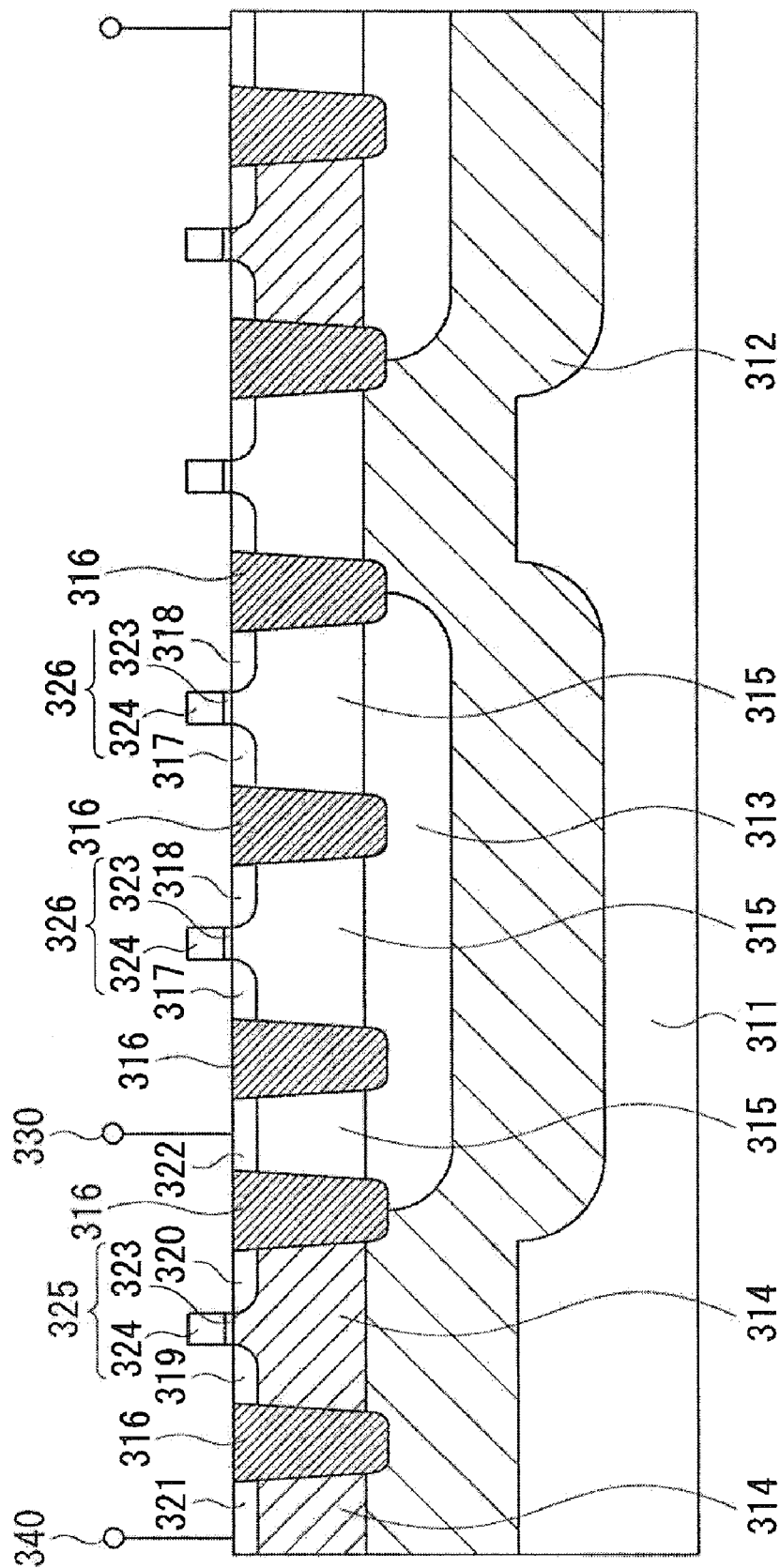
FIG. 1 is a view of a construction of a conventional MOS transistor including a deep n-well formed over an entire surface of a substrate.

FIG. 1 illustrates a construction of a MOS transistor disclosed in Japanese Patent Application Laid-Open Publication No. 2002-158293. In FIG. 1, a deep n-well 312 is formed on a p-type substrate 311, and a voltage supply terminal 340 is connected via the deep n-well 312 to an n-well 314 of a substrate bias variable PMOS transistor 325. Note that the substrate bias variable PMOS transistor 325 includes a gate electrode 324, a gate insulating film 323, a source 319, a drain 320 and an n-well 314.

Further, a deep p-well 313 is formed in an upper layer higher than the deep n-well 312, and a voltage supply terminal 330 is connected via the deep p-well 313 to a p-well 315 of a substrate bias variable NMOS transistor 326. Note that the substrate bias variable NMOS transistor 326 includes a gate electrode 324, a gate insulating film 323, a source 317, a drain 318 and a p-well 315.

As shown in FIG. 1, the number of terminals for supplying well voltages can be reduced by taking the construction of controlling the well voltages of the p-wells 315 of a plurality of substrate bias variable NMOS transistors 326 via the deep p-well 313 from the voltage supply terminal 330. Similarly, the number of terminals for supplying well voltages can be reduced by taking the construction of controlling the well voltages of the n-wells 314 of a plurality of substrate bias variable PMOS transistors 325 via the deep n-well from the voltage supply terminal 340.

In the Patent document 3, however, as illustrated in FIG. 1, the deep n-well 312 is common within a single substrate 311. Hence, the well voltages of the multiplicity of p-type substrate bias variable transistors 325 can be controlled by supplying the voltage to one voltage supply terminal. Even in such a case that some of the p-type substrate bias variable transistors 325 are required to be made active, however, it follows that all of the substrate bias variable transistors 325 become active, resulting in an increase in leak current.

The Patent document 3 aims at solving this point, wherein an n-type deep well region and a p-type deep well region are respectively formed within the p-type silicon substrate. Namely, this technology is that the plurality of n-type substrate bias variable transistors shares the p-type well region with each other, thus building up a plurality of circuit blocks. Moreover, the plurality of p-type substrate bias variable transistors shares the n-type well region with each other, thus building up a plurality of circuit blocks. This construction enables a substrate bias to be switched over for every circuit block.

Figure 2:
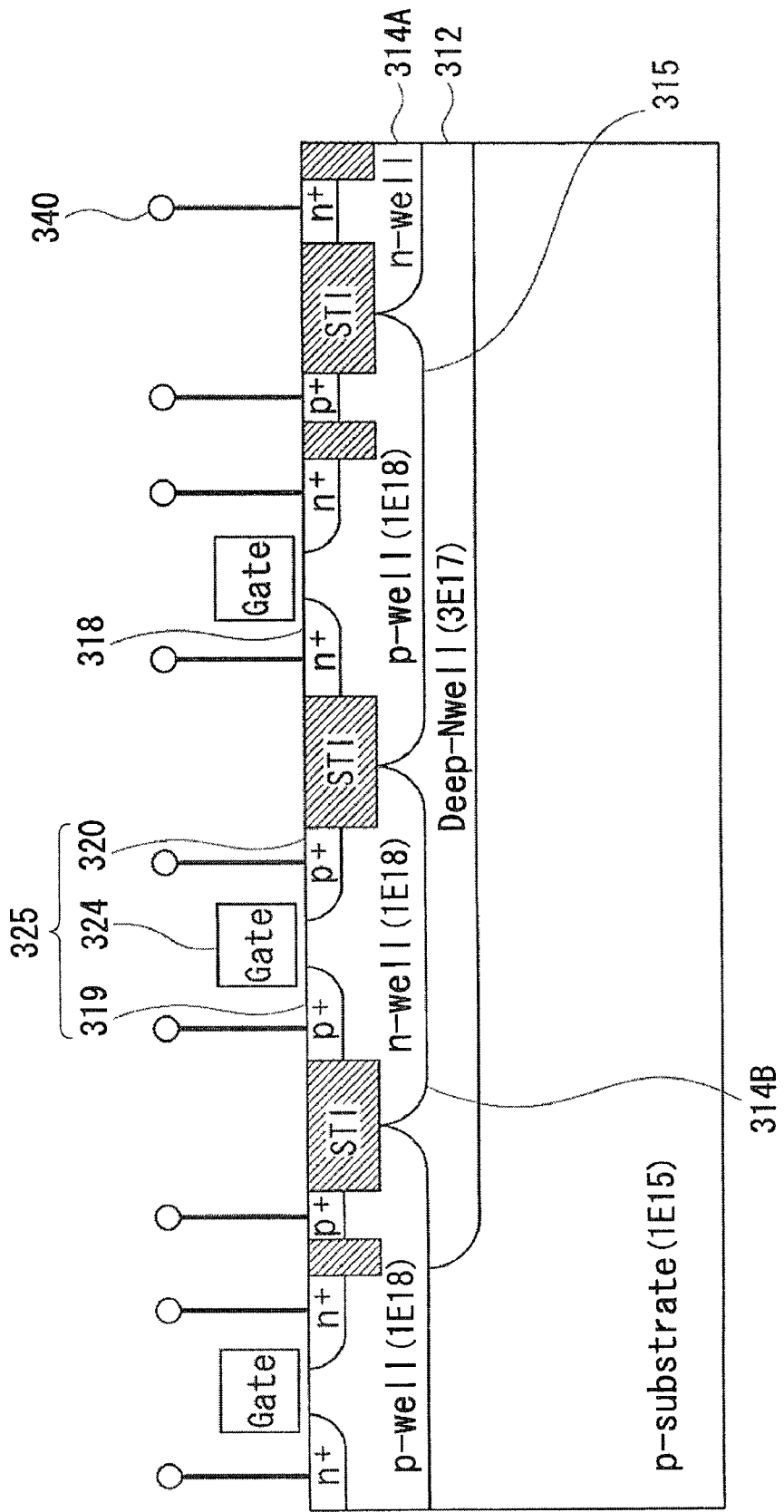
FIG. 2 is a view of the conventional MOS transistor that controls a voltage of the n-well.

FIG. 2 is a sectional view illustrating a semiconductor device in which the deep n-well 312 is formed limitedly in part of the substrate in the construction in FIG. 1. Herein, the voltage of an n-well 314B of the PMOS transistor 325 is supplied via an n-well 314A and the deep n-well 312 from the voltage supply terminal 340. Thus, in the construction in FIG. 2, the bias of the n-well 314B of the PMOS transistor 325 within a desired circuit block can be controlled through the deep-n-well 312 by supplying the voltage to one voltage supply terminal 340.

In the construction in FIG. 2, however, the control of the biases of the n-wells 314B of the plurality of PMOS transistors 325 within the desired circuit block entails forming the deep n-well 312 over an entire area within the circuit block. This results in an elongated distance from the voltage supply terminal 340 to the PMOS transistor 325, and such a case might occur that a resistance value of the deep n-well 312 can not be ignored.

Further, in the construction in FIG. 2, the voltage is supplied to the n-well 314B formed in a position where the circuit block of the p-well 315 is interposed therebetween as viewed from the voltage supply terminal 340. Consequently, the distance from the voltage supply terminal 340 to the PMOS transistor 325 elongates.

Thus, as the distance from the voltage supply terminal 340 to the PMOS transistor 325 gets longer, the resistance value of the deep n-well 312 forming a route thereof becomes larger. Therefore, the voltage of the deep n-well 312 fluctuates due to influence of signals flowing to (an electric current flowing to or a voltage applied to) each of portions of an element existing on an upper layer formed midways of the route, e.g., to a gate, a source or a drain of the transistor. Furthermore, the example in FIG. 1 shows that this range extends over a whole area of a chip.

This being the case, the Patent document 3 described above takes a construction of narrowing the range of the circuit block based on the deep n-well. Then, the plurality of circuit blocks capable of controlling the well voltages at the same timing is connected via upper wiring. If this type of construction is taken, the fluctuations of the voltage of the deep n-well can be restrained, however, the range in which the voltage can be controlled owing to the deep n-well gets narrowed. Hence, the upper wiring outside the substrate is needed for controlling the well voltages of a much larger number of substrate bias variable transistors from one voltage supply terminal.

Thus, if the voltage supply terminal 340 is distanced away from the well voltage variable element, it follows that the influence of the element existing on the substrate surface on the route therebetween can not be ignored. Namely, the well voltage fluctuates due to a change of the signals of the respective components (the gate, the source, the drain, etc) of the element. With this fluctuation, a characteristic of the well voltage variable element fluctuates, with the result that a malfunction might occur.

Such being the case, a semiconductor device is illustrated here, which is capable solving the problems given above. The semiconductor device has a first conductivity type semiconductor substrate, a voltage supply terminal provided on the semiconductor substrate, one or more elements each including a well portion of a second conductivity type different from the first conductivity type and disposed on the semiconductor substrate, a first conductive layer of the second conductivity type that is formed contiguously with the second conductivity type well portion in a lower layer under one or more elements and connects a second conductivity type well portions of one or more elements to the voltage supply terminal, and a second conductive layer of the first conductivity type that is formed contiguously with a lower side of the first conductive layer.

Herein, the first conductive layer connects the well portion of the second conductivity type of one or more elements to the voltage supply terminal. Accordingly, one or more elements including the well portions of the second conductivity type and disposed on the semiconductor substrate are controlled in terms of their well voltages via the voltage supply terminal and function as well voltage variable elements. Then, because of providing the second conductive layer of the first conductivity type that is formed contiguously with the first conductive layer in the lower layer under the first conductive layer, the first conductive layer of the second conductivity type and the second conductive layer of the first conductivity type build up a junction capacitance. Therefore, if fluctuations of the signal components of the voltage, the electric current, etc occur in the element and if the voltage of the well portion of the second conductivity type fluctuates, these fluctuations outflow to the outside via the junction capacitance, and the voltage of the first conductive layer and the voltage of the second conductivity type well portion connected to the first conductive layer are stabilized.

further, a semiconductor system may also be illustrated. The semiconductor system includes the semiconductor device as described above, the voltage supply terminal and a control device for controlling the voltage to be supplied. Yet further, a manufacturing method is illustrated which is applied to manufacture the semiconductor device as described above.

A best mode (which will hereinafter be termed an embodiment) illustrating the present invention will hereinafter be described with reference to the drawings. Configurations in the following embodiments are exemplifications, and Any of the semiconductor device, the semiconductor system and the manufacturing method is not limited to the configurations in the embodiments.

First Embodiment

A semiconductor device according to a first embodiment will hereinafter be described with reference to the drawings in FIGS. 3 through 8.

Figure 3:
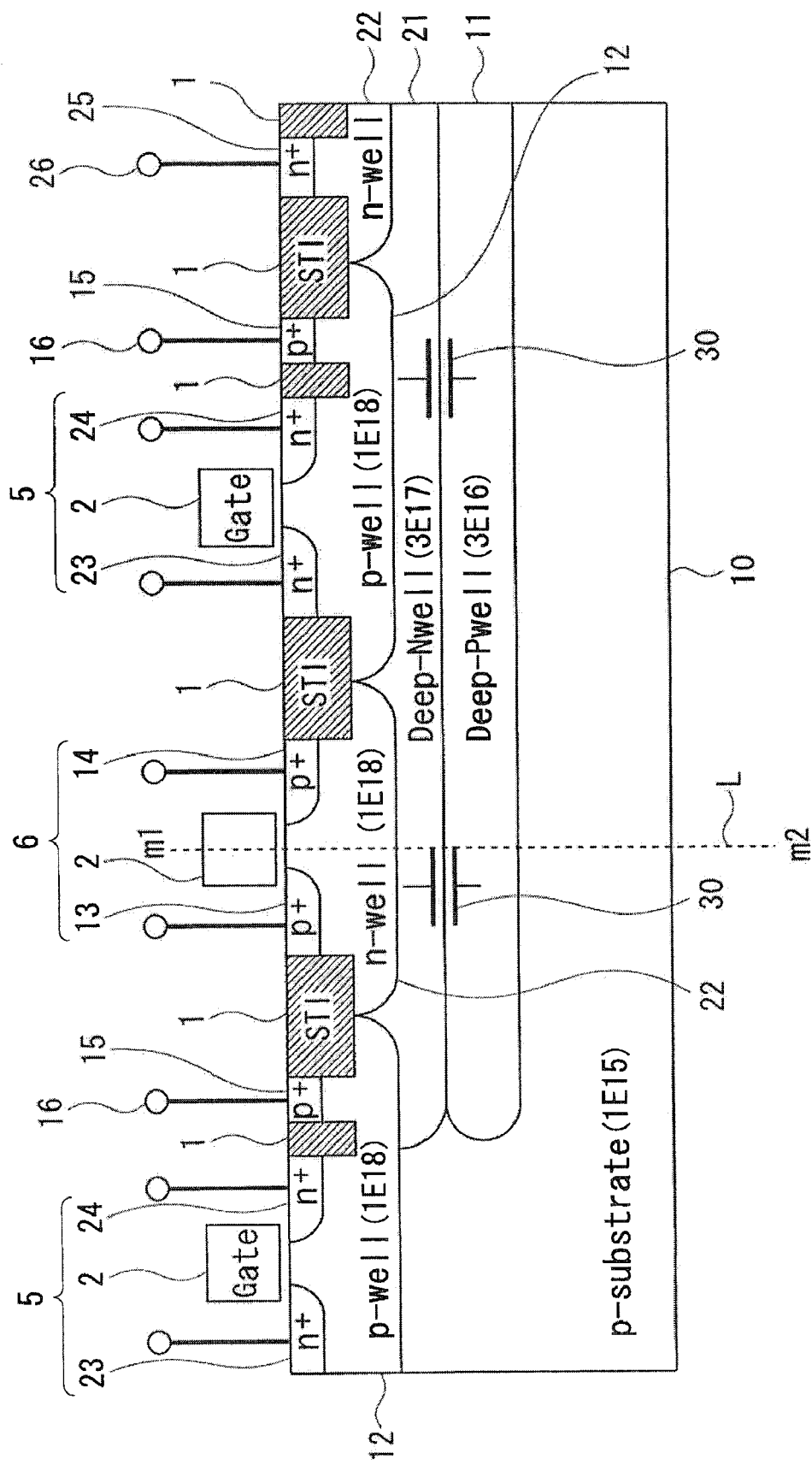
FIG. 3 is a sectional view of a semiconductor device, taken along a channel of the MOS transistor.

FIG. 3 is a sectional view illustrating the semiconductor device, shown in a section along channels of MOS transistors included in the semiconductor device. As illustrated in FIG. 3, the semiconductor device is constructed on a p-type substrate 10 (corresponding to a semiconductor substrate). The semiconductor device includes a plurality of NMOS transistors 5 and a plurality of PMOS transistors 6. The NMOS transistors 5 and the PMOS transistors 6 are isolated by device isolation insulating films 1 (corresponding to element isolation insulating portions) each called STI (Shallow Trench Isolation) from other transistors. A region in which to form the NMOS transistor 5 or the PMOS transistor 6 surrounded by the STI and the STI (interposed between the STIs) corresponds to an element region.

As in FIG. 3, a depth (corresponding to a predetermined depth) of the STI may be set to a degree enabling a p-well 12 and an n-well 22 to be disconnected (isolated). If the depth of the STI gets deeper than a bottom of the p-well 12, the p-well 12 is completely separated, and it is difficult to control well potentials of the plurality of NMOS transistors 5 from a voltage supply terminal 16. Accordingly, in the case of controlling the well potentials of the plurality of NMOS transistors 5 from one voltage supply terminal 16, it is desirable that the depth of the STI is not deeper than the bottom of the p-well 12.

The NMOS transistor 5 includes an n-type source region 23 (a high impurity concentration region) formed on the p-type well (which will hereinafter be simply termed the p-well and corresponds to a third conductive layer and to a first conductivity type well portion) 12, a drain region (a high impurity concentration region) 24, an unillustrated gate insulating film on the substrate surface between the source region 23 and the drain region 24, and a gate 2 on the gate insulating film. Note that the source region 23 and the drain region 24 may be reversed in terms of a positional relationship with respect to the gate 2 to the case illustrated in FIG. 3. The p-well 12 of the NMOS transistor 5 is connected to the voltage supply terminal 16 via a high-concentration p-type region 15. Accordingly, a substrate bias voltage is supplied to the voltage supply terminal 16, whereby the NMOS transistor 5 functions as a substrate bias variable transistor.

Namely, when the NMOS transistor 5 is in a standby status, a deep negative bias is applied to the voltage supply terminal 16. Since the deep negative bias is thereby applied to the p-well 12 of the NMOS transistor 5, the source 23 and the drain 24 of the NMOS transistor 5 and the p-well 12 come to each have a reverse bias, a depletion layer of a channel expands, and a threshold voltage rises. As a result, an off-current when in the standby status is reduced.

On the other hand, when the NMOS transistor 5 is in an active status, the negative bias of the voltage supply terminal 16 is shallowed. The bias of the p-well 12 of the NMOS transistor 5 is thereby decreased, then the reverse bias between the source 23 and the drain 24 of the NMOS transistor 5 and the p-well 12 weakens, and the threshold voltage decreases. Consequently, a drive current of the NMOS transistor 5 can be made larger than when in the standby status, and a circuit operation speed can be improved.

It is to be noted that only one NMOS transistor 5 is explicitly provided in the region of the p-well 12. The implementation of the semiconductor device is not, however, limited to the construction in FIG. 3, and a plurality of NMOS transistors 5 may be disposed in the region of the p-well 12. In this case, as already described, the depth of the STI does not, it is desirable, reach the bottom of the p-well 12.

The PMOS transistor 6 (corresponding to an element) includes a p-type source region (a high impurity concentration region) 13 formed on an n-type well (which will hereinafter be simply termed the n-well and corresponds to a second conductivity type well portion) 22, a drain region (a high impurity concentration region) 14, an unillustrated gate insulating film on the substrate surface between the source region 13 and the drain region 14, and the gate 2 on the gate insulating film. Note that the source region 13 and the drain region 14 may be reversed in terms of the positional relationship with respect to the gate 2 to the case in FIG. 3.

Further, in FIG. 3, only one PMOS transistor 6 is explicitly provided in the region of the n-well 22. The implementation of the semiconductor device is not, however, limited to the construction in FIG. 3, and a plurality of PMOS transistors 6 may be disposed in the region of the n-well 22.

A deep n-well 21 is formed in a next lower layer under the p-well 12 of the NMOS transistor 5 and under the n-well 22 of the PMOS transistor 6. The deep n-well 21 forms a lower layer portion under a plane region including one or plural PMOS transistors 6. Namely, the deep n-well 21 is contiguous with a bottom face of the PMOS transistor 6 with respect to a circuit block including one or plural PMOS transistors 6.

Herein, the deep n-well 21 is contiguous with the n-well 22, the implication being that an n-type impurity concentration between the deep n-well 21 and the n-well 22 is formed higher than an impurity concentration of a p-type substrate 10.

Further, the deep n-well 21 is connected to a voltage supply terminal 26 via the n-well 22 and a high-concentration n-type region 25. Accordingly, the deep n-well 21 functions as a conductive layer (corresponding to a first conductive layer) that connects the voltage supply terminal 26 to the n-well(s) 22 of one or plural PMOS transistors 6. In this construction, a substrate bias voltage is supplied to the voltage supply terminal 26, whereby the plural PMOS transistors 6 function as substrate bias variable transistors.

To be specific, when the PMOS transistor 6 is in the standby status, a high positive bias is applied to the voltage supply terminal 26. Since the high positive bias is thereby applied to the n-well 22 of the PMOS transistor 6, the source 13 and the drain 14 of the PMOS transistor 6 and the n-well 22 come to each have a reverse bias, then a depletion layer of a channel expands, and a threshold voltage rises. As a result, an off-current when in the standby status is decreased.

On the other hand, when the PMOS transistor 6 is in the active status, the positive bias of the voltage supply terminal 26 is lowered. The bias of the n-well 22 of the PMOS transistor 6 is thereby decreased, then the reverse bias between the source 13 and the drain 14 of the PMOS transistor 6 and the n-well 22 weakens, and the threshold voltage decreases. Consequently, a drive current of the PMOS transistor 6 can be made larger than when in the standby status, and the circuit operation speed can be improved.

Moreover, FIG. 3 exemplifies that the p-wells 12 and the n-wells 22 are provided by twos on the upper layer above the deep n-well 21. Herein, the two n-wells 22 are disposed with the p-well 12 being interposed therebetween, and the deep n-well 21 extends through the lower layer under the p-well 12 and thus connects these two n-wells 22. Furthermore, the deep n-well 21 is connected to the voltage supply terminal 26 via the n-well 22 and the high impurity concentration n-type region 25. Thus, the deep n-well 21 connects the voltage supply terminal 26 to the n-wells 22 located with the p-well 12 being interposed therebetween.

It should be noted that the implementation of the semiconductor device is not limited to the construction in FIG. 3, more multiple p-wells 12 and n-wells 22 may be formed on the upper layer above the deep n-well 21. Further, in the semiconductor device in the first embodiment, these deep n-wells 21 are formed in a plurality of positions within the substrate in FIG. 3.

A characteristic of the semiconductor device lies in such a point that a deep p-well 11 (corresponding to a second conductive layer) is provided on a next lower layer under the deep n-well 21. As described above, normally, a voltage higher than an earth voltage is supplied to the voltage supply terminal 26. On the other hand, the p-type substrate 10 is set normally to the earth potential. Hence, the reverse bias occurs between the deep n-well 21 and the deep p-well 11, thereby forming a junction capacitance 30.

Thus, in the semiconductor device illustrated in FIG. 3, the deep p-well 11 is formed on the p-type substrate 10, and the deep n-well 21 is formed on the upper layer above the p-well 11. The deep n-well 21 is connected to the voltage supply terminal 26 via the n-well 22 and the high impurity concentration n-type region 25. Further, the n-well 21 is contiguous, with the n-well 22 of the PMOS transistor 6 and therefore functions as a conductive layer that connects the voltage supply terminal 26 to the n-well 22 of the PMOS transistor 6. Still further, the deep n-well 21 cooperates with the deep p-well 11 to form the junction capacitance 30 and is, it follows, connected to the p-type substrate 10.

Figure 4:
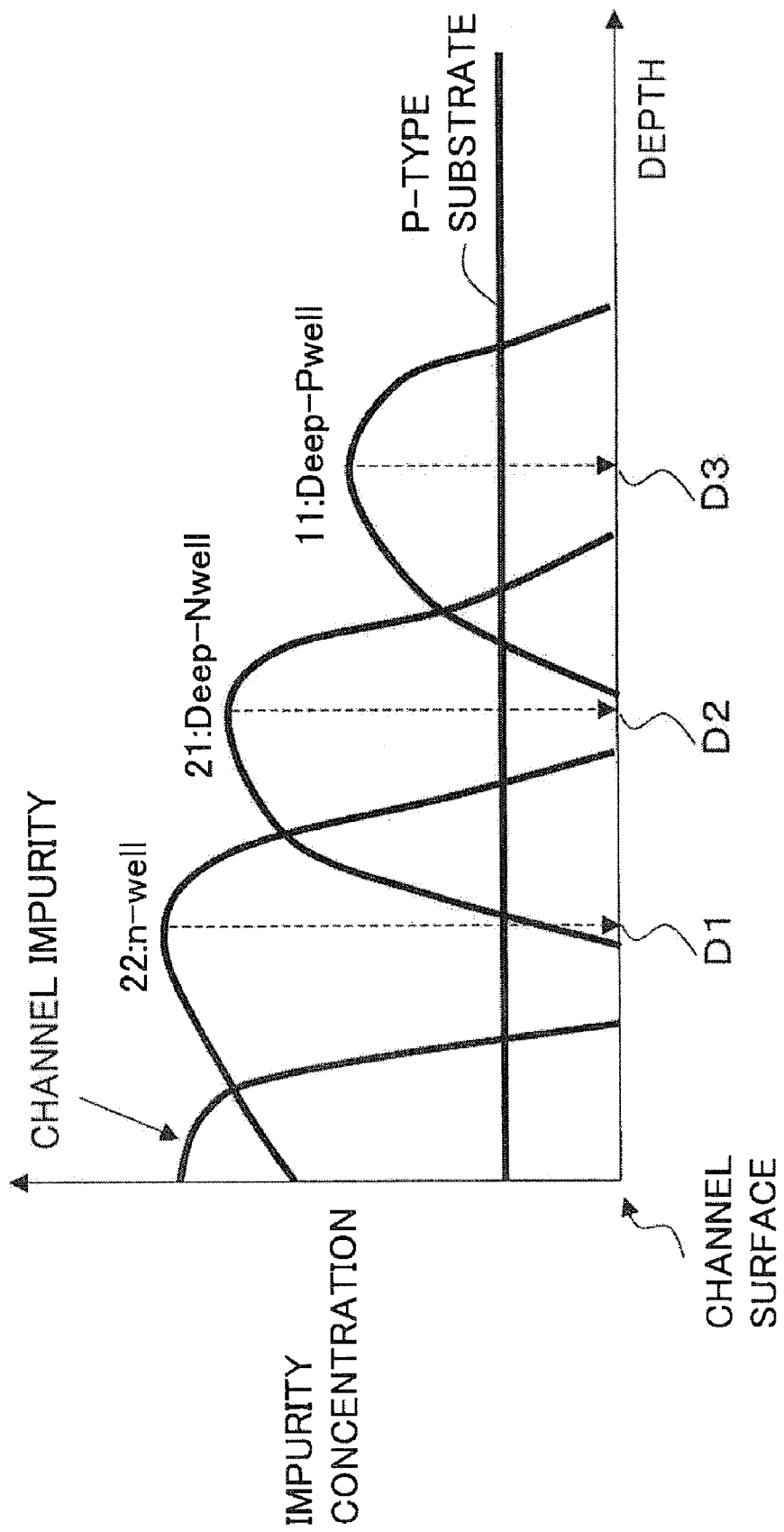
FIG. 4 is a view illustrating an impurity concentration distribution in a depthwise direction in section.

FIG. 4 is a view illustrating a distribution of the impurity concentrations in a depthwise direction (from a point m1 toward a point m2 along a straight line L in FIG. 3) in section in FIG. 3. In FIG. 4, the axis of abscissa corresponds to the depth within the substrate, while the axis of ordinate represents the concentration of each impurity on a log scale. In FIG. 4, the axis of abscissa shows a range extending from a position in the vicinity of a channel surface just under the gate insulating film down to the point having original characteristics of the p-type substrate 10 that is the much lower layer than the deep p-well 11.

As shown in FIG. 4, a channel impurity is doped into the channel surface. The concentration of the channel impurity decreases in the depthwise direction monotonously from a peak level on the channel surface.

A surface region (which is a region in a predetermined range in the depthwise direction) to be doped with the channel impurity is doped with an impurity (donor) of the n-well 22. A concentration distribution of the impurity of the n-well 22 takes roughly a single-peaked shape. To be specific, the concentration distribution is that the concentration gradually rises from the channel surface in the depthwise direction, and the peak is formed at a depth D1. Then, the concentration of the impurity of the n-well 22 sharply decreases from the depth D1 in a much deeper direction. The concentration of the impurity of the n-well 22 at the peak (the depth D1) is typically on the order of $1 \times 10^{18}/cm^3$.

The lower layer under the n-well 22 is doped with the impurity of the deep n-well 21. A concentration of the impurity of the deep n-well 21 takes roughly the single-peaked shape, in which the peak is given at a depth D2 (which is a position deeper than the depth D1). Specifically, the concentration distribution is such that the concentration rises step by step from the vicinity of the depth D1 in the depthwise direction, and the peak is formed at the depth D2. Then, the concentration of the impurity of the deep n-well 21 abruptly decreases from the depth D2 in an even deeper direction. The concentration of the impurity of the deep n-well 21 at the peak (the depth D2) is typically on the order of $3 \times 10^{17}/cm^3$.

The lower layer under the deep n-well 21 is doped with an impurity (acceptor) of the deep p-well 11. A concentration of the impurity of the deep p-well 11 takes roughly the single-peaked shape, wherein the peak is given at a depth D3 (which is a position deeper than the depth D2). To be specific, in the concentration distribution, the concentration gradually increases from the vicinity of the depth D2 in the depthwise direction, and the peak is formed at the depth D3. Then, the concentration of the impurity of the deep p-well 11 decreases from the depth D3 in the much deeper direction.

The concentration of the impurity of the deep p-well 11 at the peak (the depth D3) is typically on the order of $3 \times 10^{16}/cm^3$. Namely, it is desirable that the concentration of the impurity of the deep p-well 11 is lower than the concentration of the impurity of the deep n-well 21. The reason why so is that if the concentration of the impurity of the deep p-well 11 increases, the deep n-well 21 is eroded, the p-type impurity penetrates into the deep n-well 21, a resistance value of the deep n-well 21 rises, and further the region might not function as the n-type region.

Note that as illustrated in FIG. 4, the original concentration of the impurity of the p-type substrate 10 is substantially fixed without depending on the depth and is, for example, on the order of $1 \times 10^{15}/cm^3$.

As shown in FIG. 4, it is preferable that the peak position D3 of the concentration of the impurity of the deep p-well 11 is formed much deeper than the peak position D2 of the concentration of the impurity of the deep n-well 21. In a portion between the deep n-well 21 and the deep p-well 11, however, it is desirable that each of the concentrations of these impurities is set higher than the original concentration of the impurity of the p-type substrate 10. This is because if the portion between the deep n-well 21 and the deep p-well 11 has a concentration lower than the original concentration of the impurity of the p-type substrate 10, a p-n junction between the deep p-well 11 and the deep n-well 21 weakens, and the junction capacitance 30 decreases.

Herein, let Nd be the concentration of the impurity of the deep n-well 21 and Na be the concentration of the impurity of the deep p-well 11, and a value C of the junction capacitance 30, per unit area of the junction portion, is proportional to $1/(1/Nd+1/Na)^{1/2}$.

Accordingly, an approximately 3-fold increase of the junction capacitance can be obtained by increasing tenfold each of the concentration of the impurity of the deep n-well 21 and the concentration of the impurity of the deep p-well 11.

Further, if the deep p-well 11 does not exist as hitherto practiced, a junction capacitance C0 takes a value given below, where k is a constant of proportionality. Herein, Nsub is a concentration of the impurity of the p-type substrate 10.

$$C0 = k/(1/Nd + 1/Nsub)^{1/2} \qquad \text{(Mathematical Expression 1)}$$

Further, in the case of providing the deep p-well 11 in the first embodiment, the junction capacitance takes a value given below.

$$C1 = k/(1/Nd + 1/Na)^{1/2} \qquad \text{(Mathematical Expression 2)}$$

For example, as described above, an assumption is that the p-type substrate impurity concentration $Nsub = 1 \times 10^{15}/cm^3$, $Nd = 3 \times 10^{17}/cm^3$ and $Na = 3 \times 10^{16}/cm^3$. In this case, the junction capacitance of the semiconductor device in the first embodiment with respect to the conventional junction capacitance is given as follows.

$$C1/C0 = (1/Nd + 1/N\text{sub})^{1/2} / (1/Nd + 1/Na)^{1/2} = 5.2$$
(Mathematical Expression 3)

Accordingly, in the impurity concentration distribution exemplified above, the junction capacitance can be increased fivefold. The implementation of the present invention is not, however, limited to this type of concentration distribution.

Moreover, a conductance $2\pi fC$ of the junction capacitance is calculated from a typical clock frequency f of the signal inputted to the element such as the PMOS transistor 6 or the NMOS transistor 5 as shown in FIG. 3, and the impurity concentration Nd of the deep n-well 21 and the impurity concentration Na of the deep p-well 11 may be set so that a value of the conductance $2\pi fC$ is substantially equal to or well larger than a conductance of the deep n-well 21.

Working Example

Figure 5:
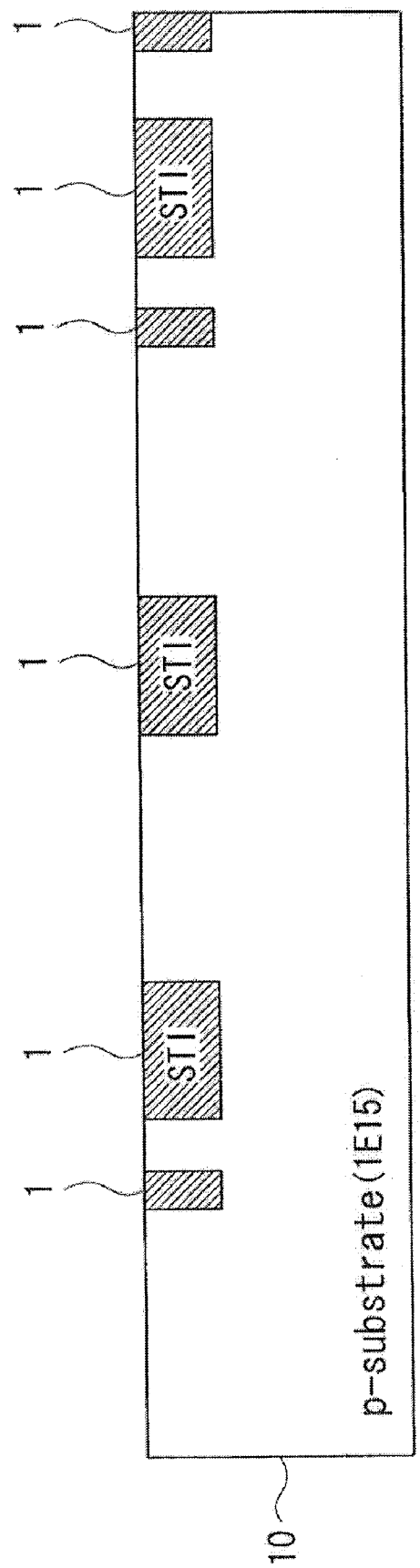
FIG. 5 is a view illustrating a manufacturing method (formation of STI) in a first working example.

A manufacturing method in a first working example will be illustrated by the drawings in FIGS. 5 through 8. To begin with, an STI 1 having a depth of 300 nm is formed in the p-type substrate 10 (FIG. 5). A variety of generation methods have hitherto been proposed as the STI forming method. The STI may be an oxide film and may also be a nitride film.

Next, a resist mask 40 is formed on the substrate. The resist mask 40 is formed by a photolithography process.

Figure 6:
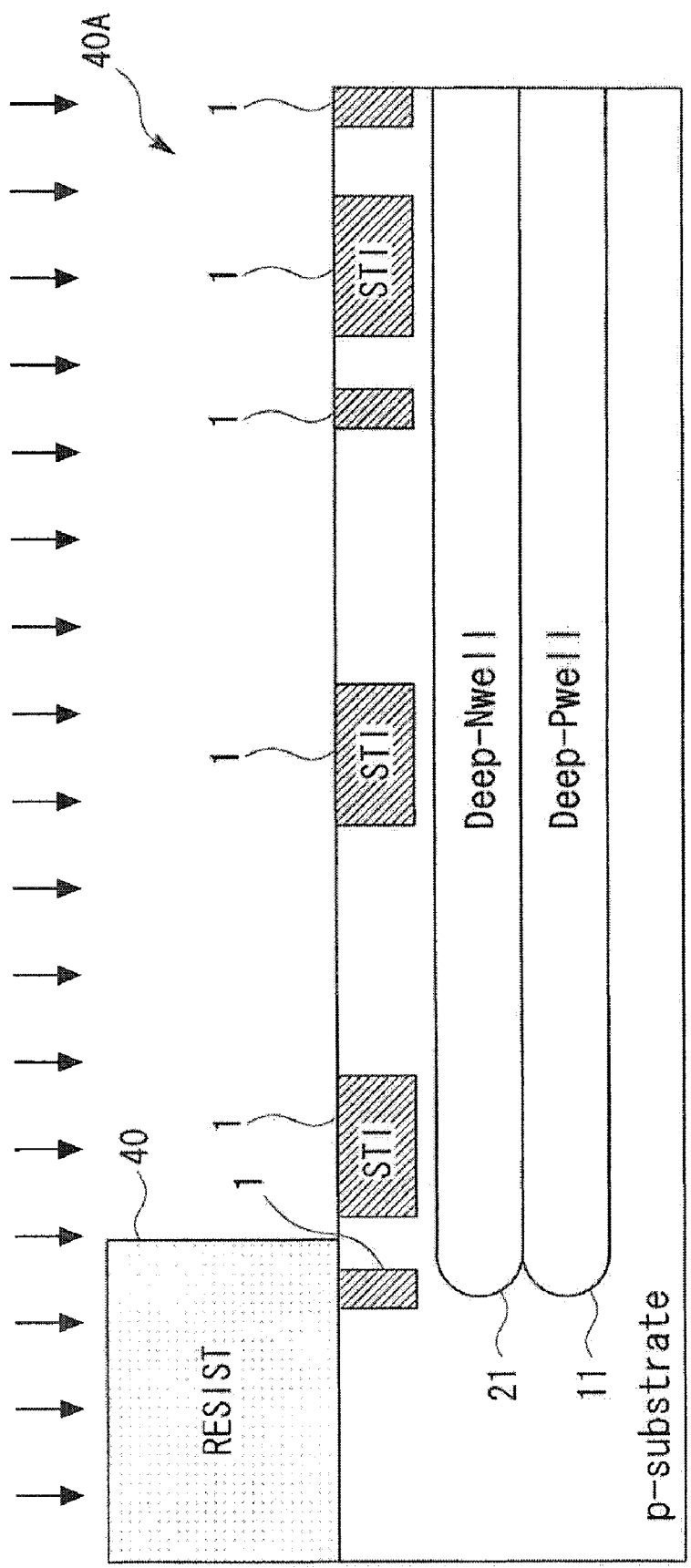
FIG. 6 is a view illustrating a manufacturing method (formation of a deep p-well region and formation of a deep n-well region) in the first working example.

Thus, a window 40A of the resist is formed in a desired region, and the deep p-well 11 is formed by an ion implantation method (FIG. 6). Herein, an ionic species is boron (B), an implantation energy is 600 KeV, a dose quantity is on the order of $1 \times 10^{12}$ cm$^{-2}$, and an angle of implantation is set at 0 degree. In this case, a depth of a peak position of the impurity is approximately 1.2 μm. The depth of the ion implantation is determined mainly by the ion species (mass), the implantation energy and a material of the target substrate. As broadly known, the depth of the implantation of the ion having a large mass is shallow, while the depth of the implantation of the ion having a large implantation energy is deep. Further, the distribution of the impurity concentration within the substrate takes a known distribution function centered at a position of a range distance determined by the ion species, the energy and the target.

Further, the deep n-well 21 is formed based on the ion implantation method by use of the same resist mask. Herein, the ion species is phosphorus, the implantation energy is 800 KeV, the dose quantity is $1 \times 10^{13}$ cm$^{-2}$, and the angle of implantation is set at 0 degree. In this case, the depth of the peak position of the impurity is approximately 0.9 μm.

Figure 7:
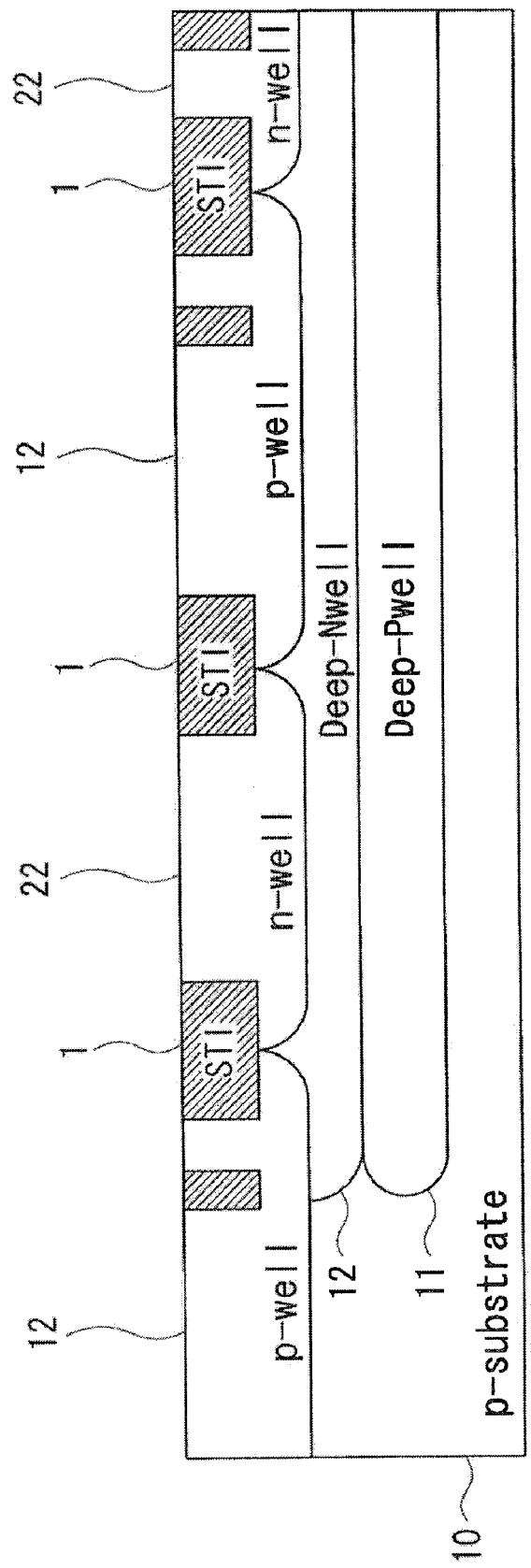
FIG. 7 is a view illustrating a manufacturing method (formation of a p-well region and formation of an n-well region) in the first working example.

Next, the n-well 22 and the p-well 12 are formed by the conventional manufacturing method (FIG. 7). These well regions can be formed by, e.g., photolithography-based patterning and the ion implantation.

Subsequently, the gate 2 is formed by the conventional manufacturing method. The gate 2 can be formed by forming a polycrystalline silicon film based on a CVD (Chemical Vapor Deposition) method, performing resist patterning based on the photolithography and etching the polycrystalline silicon film.

Figure 8:
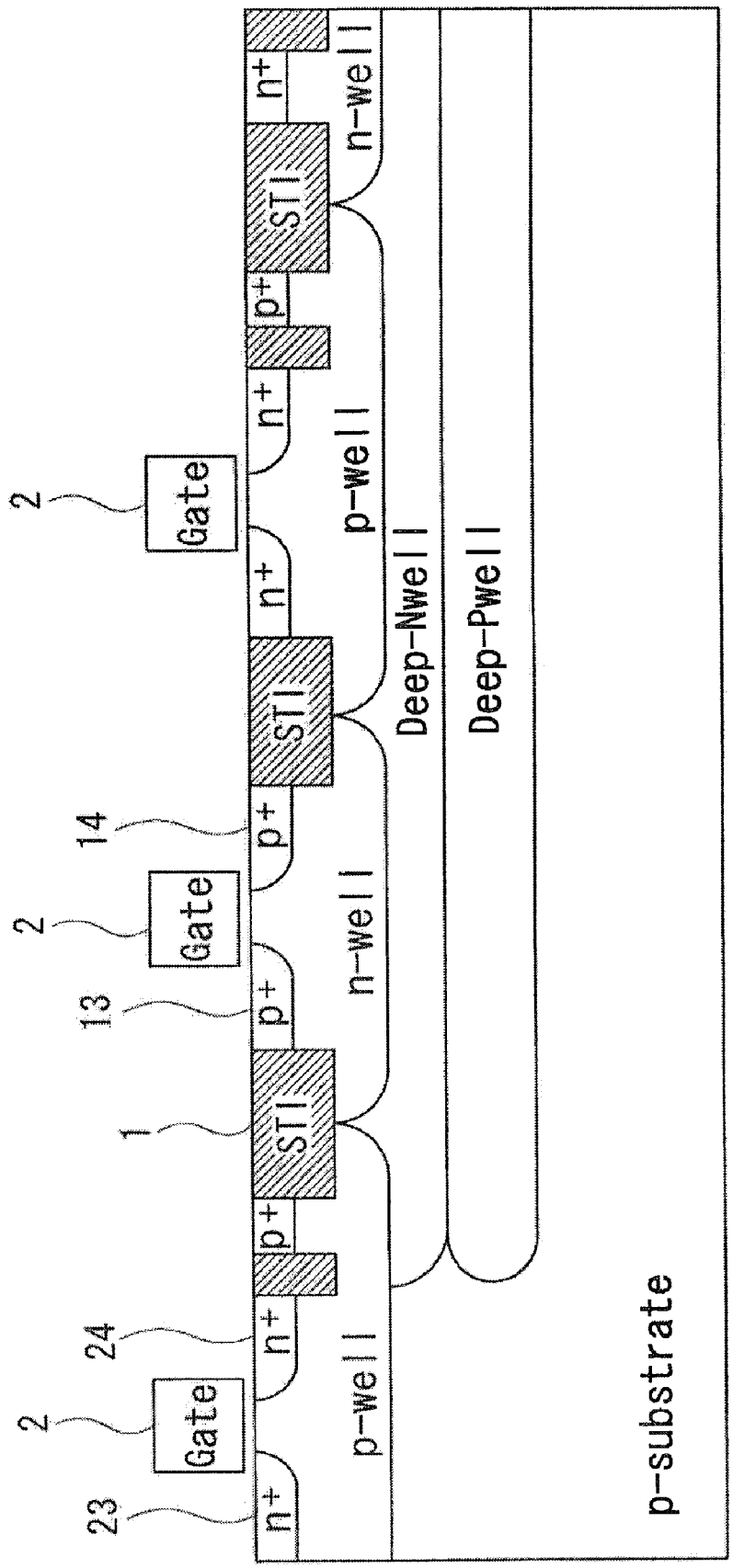
FIG. 8 is a view illustrating a manufacturing method (formation of a source, drain and a gate) in the first working example.

Furthermore, the impurities are implanted into the source region 23 (13) and the drain region 24 (14) by the ion implantation, wherein a gate electrode serves as a mask (FIG. 8). After patterning the resist with the source region 23 (13) and the drain region 24 (14) serving as windows, however, the ion implantation may also be conducted. Note that at this time, the high impurity concentration p-type region 15 or the high impurity concentration n-type region 25 illustrated in FIG. 3 is formed also by the ion implantation.

A source/drain extension region may be formed in a source/drain region. The source/drain extension region is a region extending from each of the source region 23 (13) and the drain region 24 (14) in the channel direction under a gate oxide film. The extension region is formed by doping shallow the impurity of the same conductivity type as the conductivity type of each of the source region 23 (13) and the drain region 24 (14). Next, the MOS transistor is completed by forming the wiring including the voltage supply terminal (the illustration is omitted).

<Example Applied to System LSI>

Figure 9:
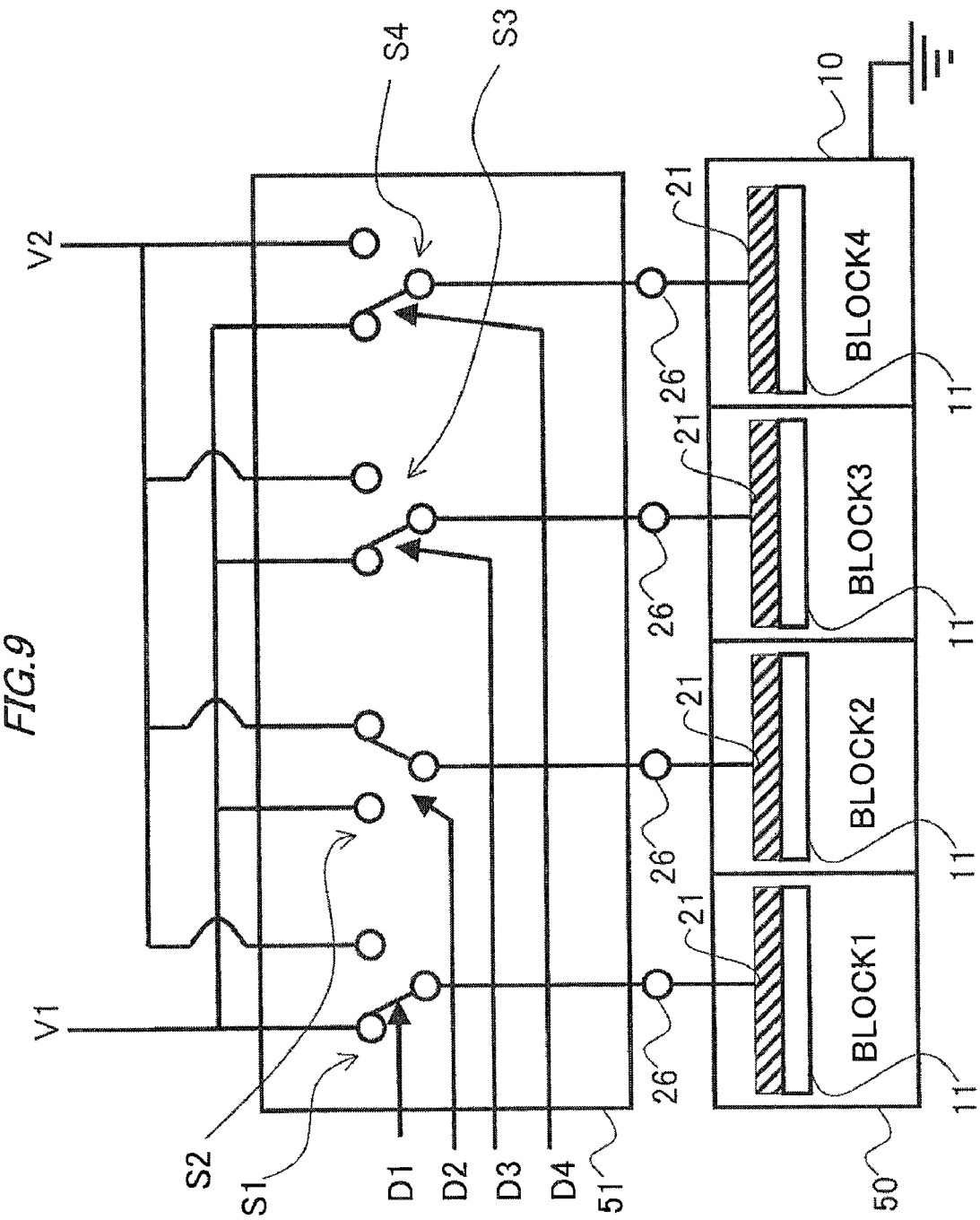
FIG. 9 is a view illustrating an example applied to a system LSI of the semiconductor device.

FIG. 9 is a view illustrating an example applied to an LSI system of the semiconductor device constructed according to the first embodiment. FIG. 9 exemplifies a system LSI 50 and a switch circuit 51 (corresponding to a control device).

The system LSI 50 includes circuit blocks consisting of a block 1 (which is depicted by a character string BLOCK1 in FIG. 9, and the expression is hereinafter the same) through a block 4. In each circuit block, the deep n-well 21 and the deep p-well 11 build up the p-n junction. Further, the p-type substrate 10 of the system LSI 50 is set to the earth potential. Note that the p-well 12 and the n-well 22 are omitted in FIG. 9.

Moreover, the switch circuit 51 supplies a voltage V1 or a voltage V2 to the system LSI 50 in a way that switches over V1 and V2 according to signals D1-D4 transmitted to a control terminal. It is to be noted that the system LSI 50 and the switch circuit 51 may also be, though explained as different chips herein, constructed as a single system LSI chip.

As illustrated in FIG. 9, the switch circuit 51 has a switch S1 through a switch S4. In each of these switches, two terminals on the input side are connected to constant voltage sources of V1 and V2. Further, a common terminal of each of the switches S1-S4 is connected to the voltage supply terminal 26 of each of the circuit blocks (the block 1 through the block 4).

The common terminal of each of these switches S1-S4 has a construction enabling the terminal itself to be switched over to any one of the right and left terminals according to the control signals D1-D4. For example, by setting such as D1=HI, D2=LO, D3=HI and D4=HI, the common terminals of the switches S1, S3 and S4 can be connected to V1, and the common terminal of the switch S2 can be connected to V2. These switches can be constructed of a general type of CMOS circuits. In this case, for example, V1 is set to a positive low bias, while V2 is set to a positive high bias. Namely, a relationship is established such as 0<V1<V2<Vcc, where Vcc is a power source voltage.

An active circuit block is biased weakly by supplying V1 to the voltage supply terminal 26. The circuit block being thus biased, the reverse bias of the n-well 22 of the PMOS transistor 6 included in this circuit block is set shallow via the deep n-well 21, and the threshold voltage is decreased, thereby enabling the circuit to operate fast.

The circuit block kept in the standby status is biased strongly by supplying V2 to the voltage supply terminal 26. The circuit block being thus biased, the reverse bias of the n-well 22 of the PMOS transistor 6 included in this circuit block is set deep via the deep n-well 21, and the threshold voltage is increased, thereby enabling the off-current to be reduced.

In any case, since the p-type substrate 10 is set to the earth, the deep n-well 21 and the deep p-well 11 come to have the reverse biases, and the junction capacitance is kept. Accordingly, even when the potential of the deep n-well 21 fluctuates due to the signal occurring in the element on the system LSI 50, the fluctuation of this potential exits the p-type substrate 10 via the junction capacitance to the earth. The malfunction of the element on the system LSI 50 can be therefore reduced.

Further, the substrate bias can be set for every circuit block (BLOCK1 through BLOCK4) by taking the circuit configuration as in FIG. 9, and it is feasible to reduce an increase in the off-current due to the unused elements being biased in the active status with futility. Therefore, the power consumption of the system LSI 50 can be decreased.

Figure 10:
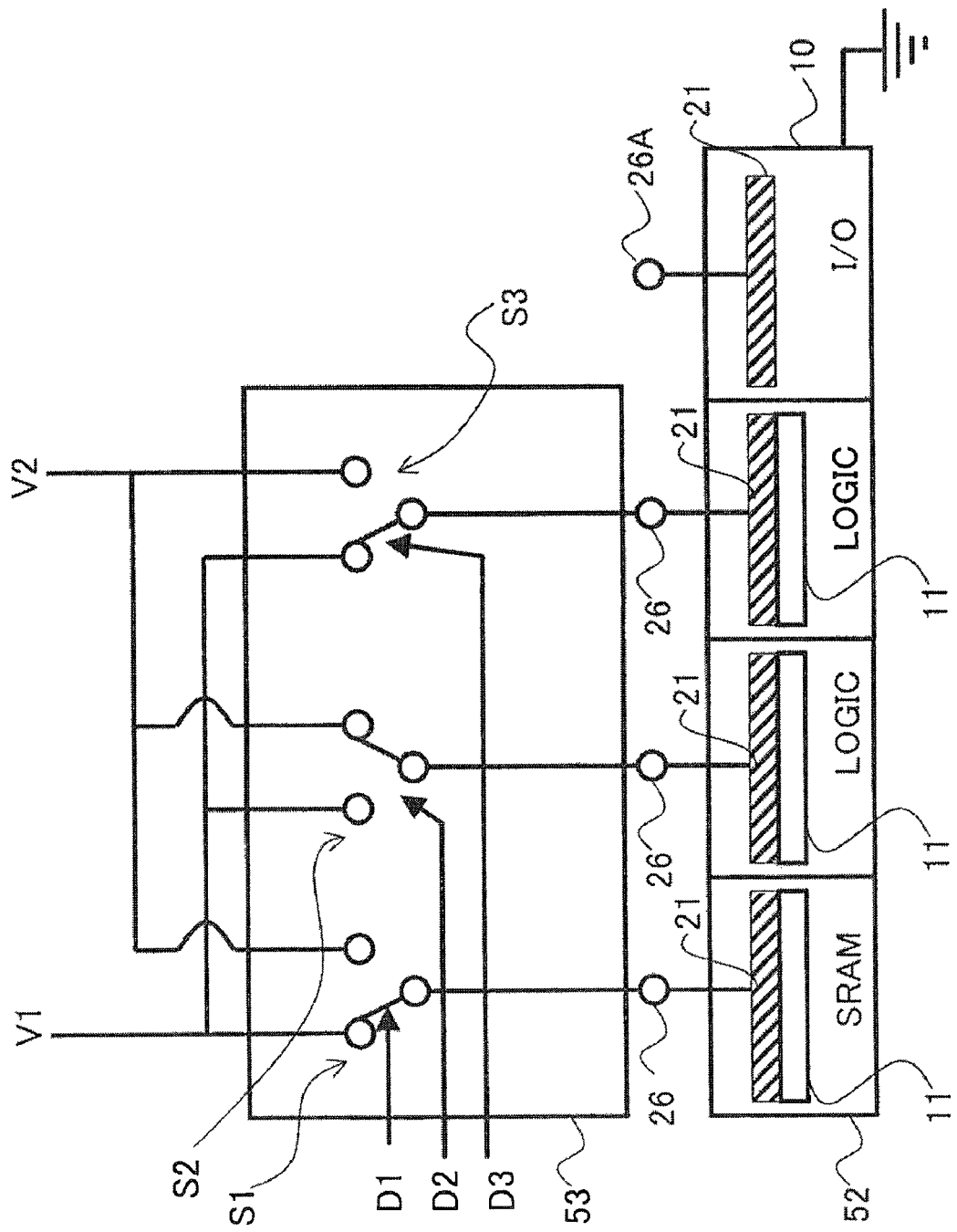
FIG. 10 is a view illustrating an example applied to another system LSI of the semiconductor device.

FIG. 10 shows an example applied to another system LSI. FIG. 10 exemplifies a system LSI 52 and a switch circuit 53. A construction of the system LSI 52 is the same as the system LSI 50 in FIG. 9 has. A difference from the case in FIG. 9 is, however, such a point that the circuit blocks of the system LSI 52 are an SRAM, LOGICs and an I/O unit, respectively.

Furthermore, the configuration of the switch circuit 53 is the same as that of the system LSI 50 in FIG. 9. The switch circuit 53 includes, however, three pieces of switches S1-S3 and is controlled by three control signals D1-D3, which point is different from the switch circuit 51 having the four switches. Further, the I/O unit is not formed with the deep p-well 11.

An example in FIG. 10 shows that the voltage V1 or V2 is supplied via the switch circuit 53 to the voltage supply terminals 26 of the SRAM and the two LOGICs. On the other hand, a voltage supply terminal (26A) of the circuit block of the I/O unit is supplied with none of the voltage. Thus, the substrate bias may also be controlled in the way of being narrowed down to the circuit block including the element driven fast such as the SRAM or the LOGIC circuit, or down to the circuit exhibiting the large power consumption. In the first embodiment, the deep p-well 11 is formed on the lower layer under this type of circuit.

In this case also, the circuit bock of the SRAM and the circuit blocks of the two LOGICs are supplied with the shallow positive bias voltage V1 and the deep positive voltage V2 via the switch circuit 53 in a way that switches over V1 and V2. Therefore, the deep n-well 21 and the deep p-well 11 come to have the reverse biases, and the junction capacitance is maintained. Accordingly, even when the potential of the deep n-well 21 fluctuates due to the signal occurring in the high-speed element on the system LSI 50, the fluctuation of the potential exits the p-type substrate 10 via the junction capacitance 30 to the earth. The malfunction of the high-speed element on the system LSI 50 can be therefore reduced.

Note that in the example of FIG. 10, the voltage supply terminal 26A of the I/O unit defined as the circuit block including many low-speed elements is in a floating status but may also be fixed to, for example, the shallow bias V1 or the deep bias V2.

Further, though omitted in FIGS. 9 and 10, the p-well 12 of the NMOS transistor 5 is supplied with a shallow negative bias V3 and a deep negative bias V4 (−V4<−V3<0) via the voltage supply terminal 16 as illustrated in FIG. 3. The configuration of the switch circuit in this case can involve using the same configuration as the switch circuit 51 in FIG. 9 or the switch circuit 53 in FIG. 10 has. In this case, the p-well 12 of the NMOS transistor 5 has the reverse bias with respect to the deep n-well 21. Hence, the voltage fluctuation, with which the signal transmitted through the gate 2, the source 23 and the drain 24 of the NMOS transistor 5 accompanies, can be propagated to the deep n-well 21 via the junction capacitance of the reverse bias. This voltage fluctuation exits the p-type substrate 10 via the junction capacitance 30 to the earth, and therefore the malfunction of the element on the system LSI 50 can be reduced.

Second Embodiment

A semiconductor device according to a second embodiment will hereinafter be described with reference to the drawings in FIGS. 11 through 15.

In the first embodiment, the deep n-well 21 and the deep p-well 11 are formed in every desired circuit block including the plurality of elements by the resist patterning and the ion implantation. This construction enables the junction capacitance to be formed between the p-type substrate 10 and the deep n-well 21 with respect to the desired circuit block. Accordingly, for example, the substrate bias is controlled for the circuit block having the multiplicity of fast elements, and the voltage fluctuation of the deep n-well 21 can be reduced.

The manufacture of the semiconductor having such a construction, however, entails forming the deep p-well 11 by controlling the shape accurately. Moreover, the formation of the deep p-well 11 entails setting deep a depth of the implantation when performing the ion implantation. For example, as for the same ion species, the ion is required to be implanted in the way of being accelerated with the high energy. In the case of the first embodiment, the ion implantations is carried out, wherein the ion species is boron, the implantation energy is 600 KeV, and the angle of implantation is set at 0 degree. It is required that a resist mask 40 be sufficiently thickened in order for this type of ion having the large depth of implantation not to penetrate the resist mask 40.

If the resist mask 40 is thickened, however, the micronization gets difficult. This being the case, the second embodiment solves the problem of the micronization of the resist mask 40 by forming the deep p-well 11 over the entire surface of the chip. Other constructions and operations of the semiconductor device according to the second embodiment are the same as those in the first embodiment. Then, the same components are marked with the same numerals and symbols, and their explanations are omitted.

Working Example

Figure 11:
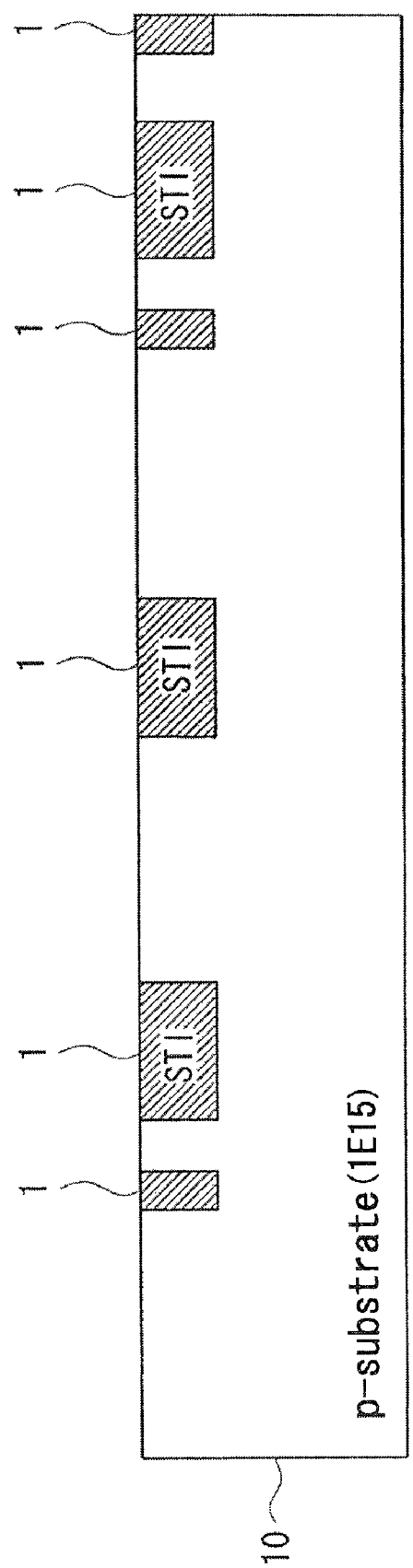
FIG. 11 is a view illustrating a manufacturing method (formation of STI) in a second working example.
Figure 12:
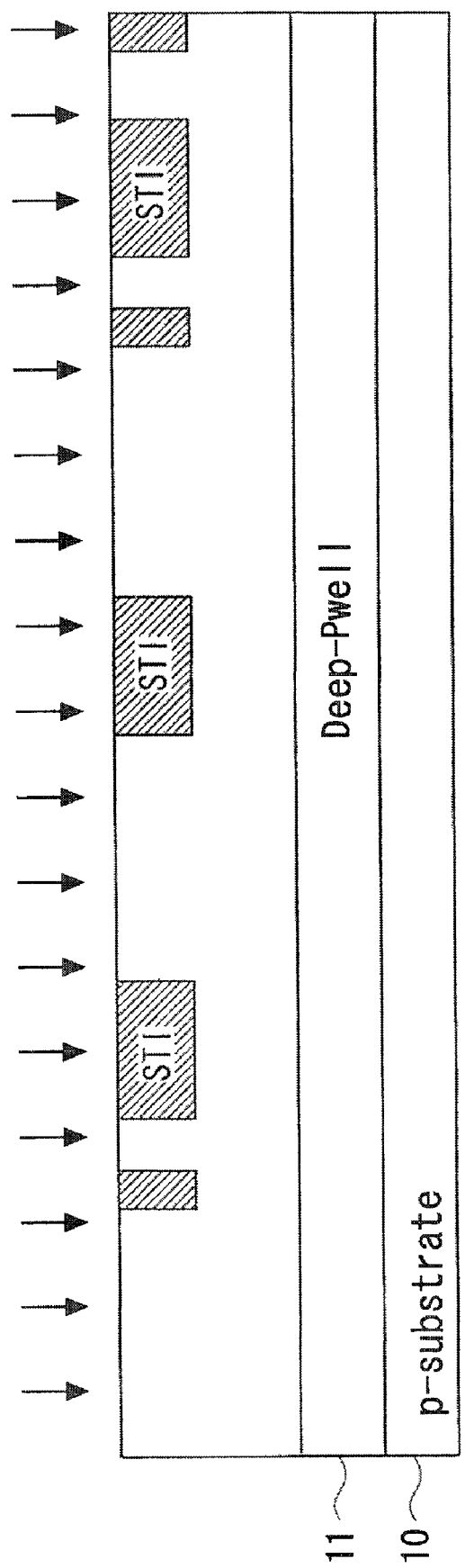
FIG. 12 is a view illustrating a manufacturing method (formation of a deep p-well region) in the second working example.

A manufacturing method of the semiconductor device according to the second embodiment will be illustrated in FIGS. 11 through 14. To start with, similarly to the case of the first embodiment, the STI 1 having the depth of 300 nm is formed in the p-type substrate 10 (FIG. 11). Next, the deep p-well 11 is formed over the entire surface of a wafer by the ion implantation method (FIG. 12). The setting is that the ionic species is boron (B), the implantation energy is 600 KeV, the dose quantity is on the order of $1 \times 10^{12}$ cm$^2$, and the angle of implantation is 0 degree.

Figure 13:
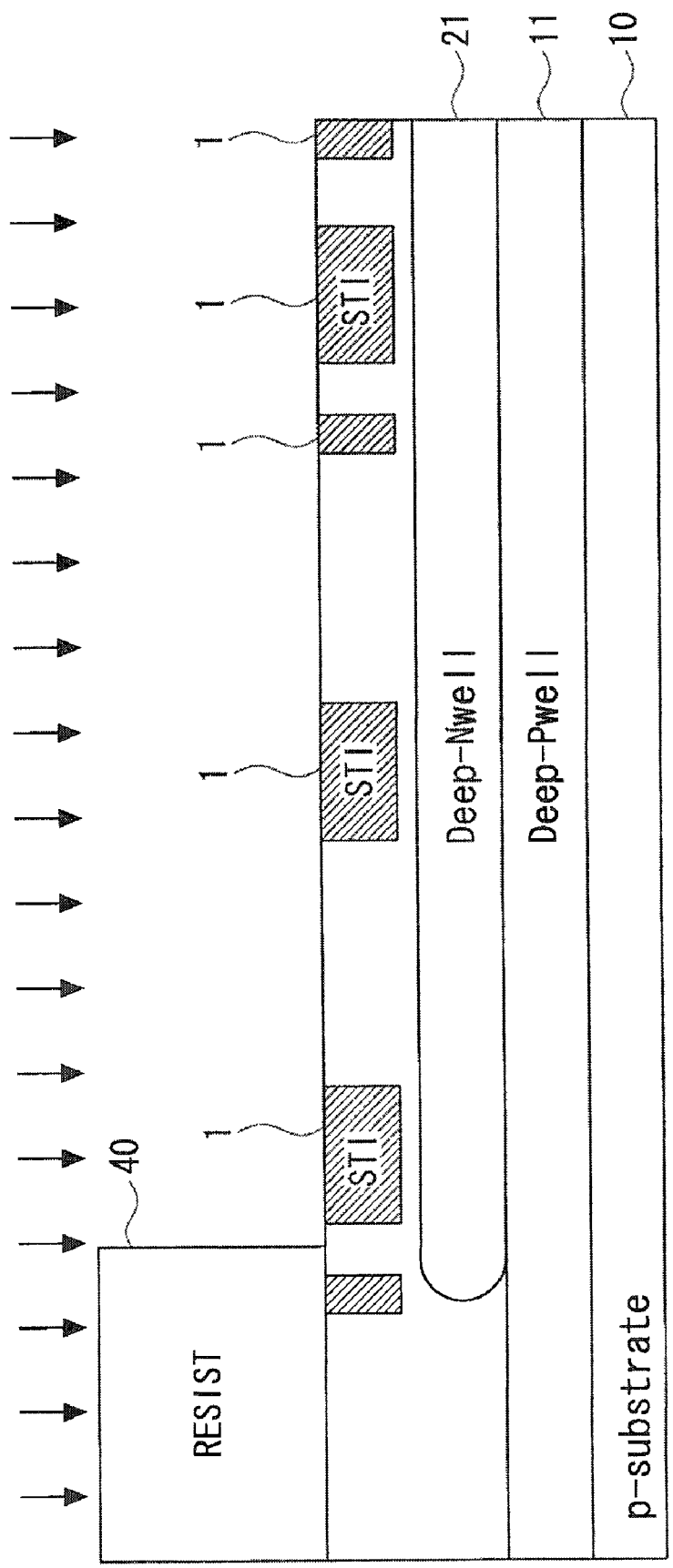
FIG. 13 is a view illustrating a manufacturing method (formation of a deep n-well region) in the first working example.

Next, the deep n-well 21 is formed in a desired region by the ion implantation via the resist mask 40. The setting is that the ionic species is phosphorus, the implantation energy is 800 KeV, the dose quantity is on the order of $1 \times 10^{13}$ cm$^{-2}$, and the angle of implantation is 0 degree (FIG. 13). In this case, the phosphorus has a large mass, and hence, even when the implantation energy is higher than 600 KeV of boron, the depth of the ion implantation remains in a shallow position. Therefore, a small film thickness of the resist may be sufficient, and the micronization of the deep n-well 21 is more facilitated than the deep p-well 11.

Figure 14:
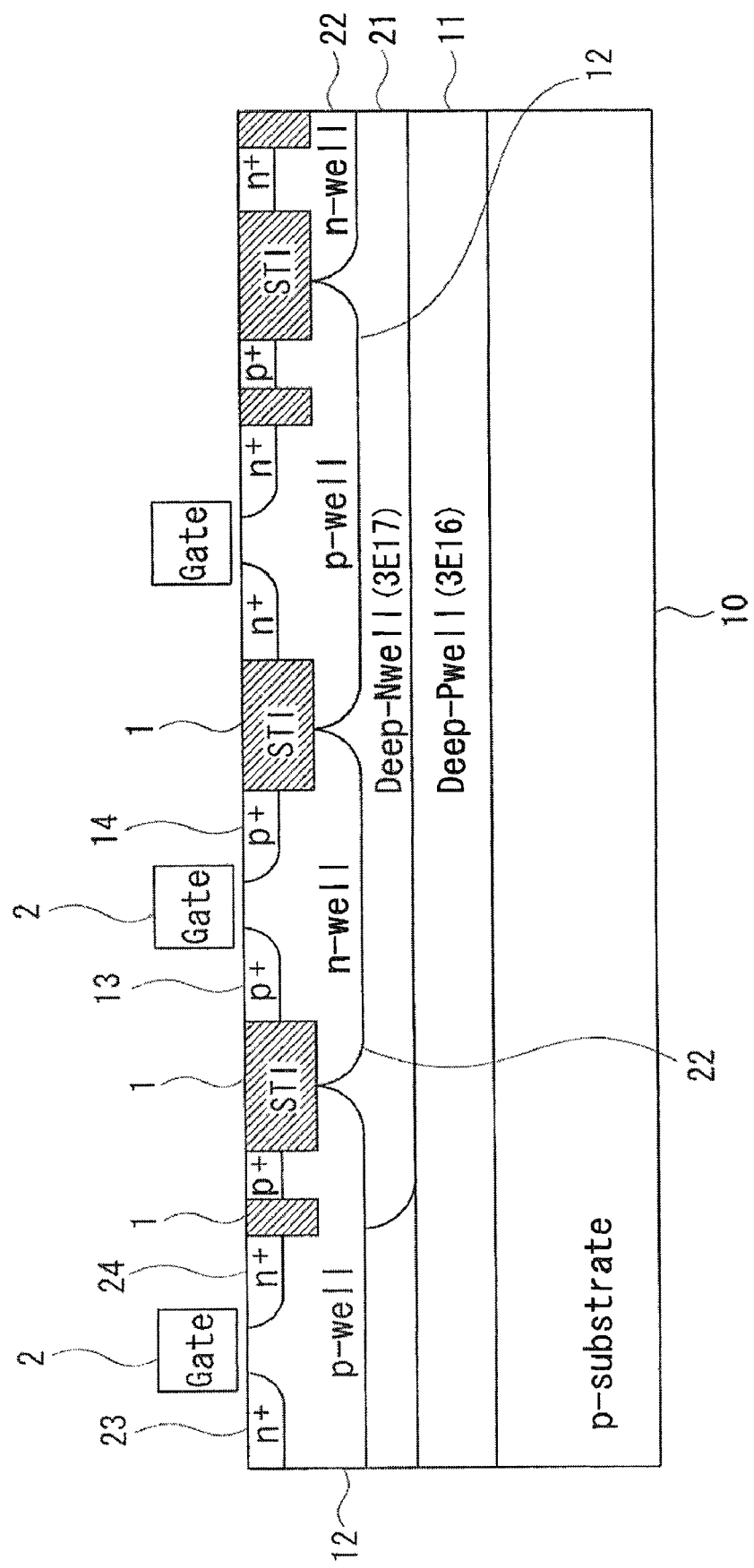
FIG. 14 is a view illustrating a manufacturing method (formation of a source, drain and a gate) in the second working example.

Next, by the conventional manufacturing method, the n-well 22 and the p-well 12 are formed, the gate 2 is formed, and the source 23 (13) and the drain 24 (14) are formed (FIG. 14). A source/drain extension may be formed over the regions of the source 23 (13) and the drain 24 (14). Subsequently, the MOS transistor is completed by forming the wiring including the voltage supply terminal (the illustration is omitted).

Figure 15:
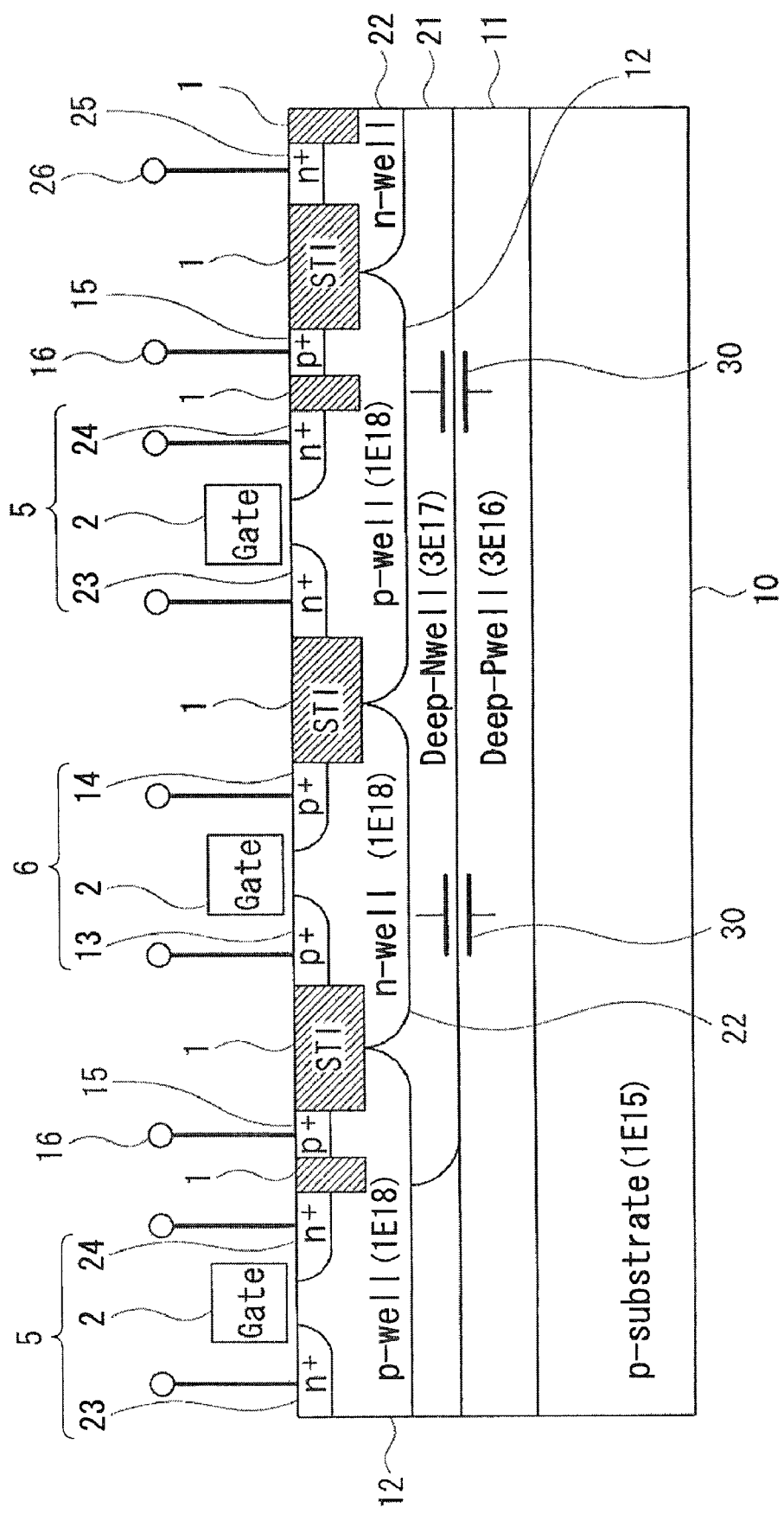
FIG. 15 is a sectional view of the semiconductor device in the second embodiment.

FIG. 15 shows a sectional view illustrating the semiconductor device in the second embodiment, which is based on the processes described above. The second working example acquires the same effects as in the first working example.

As described above, the resist pattern is not formed for boron having the large depth of the implantation when performing the ion implantation, and boron is implanted over the whole surface of the p-type substrate 10. The deep p-well 11 is thereby formed. On the other hand, the resist pattern is formed for phosphorus having a smaller depth of implantation when conducting the ion implantation than that of boron, whereby phosphorus is implanted into the desired region on the p-type substrate 10. A plurality of deep n-well 21 can be thereby formed in the desired regions on the p-type substrate 10.

Accordingly, the desired circuit block on the p-type substrate 10 is constructed as a voltage variable element, the substrate bias is set for every circuit block, and the junction capacitance can be formed between the deep p-well 11 and the deep n-well 21 for each circuit block. In this case, the deep p-well 11 is formed over substantially the entire surface of the p-type substrate 10, and hence there is no necessity of forming the resist pattern, thereby enabling the problem of the micronization to be obviated.

Modified Example

In the first embodiment and the second embodiment, boron is used as the p-type impurity (acceptor). Further, phosphorus is employed as the n-type impurity (donor). The implementation of the present invention is not, however, limited to this construction. For example, in the case of using a group IV element such as silicon for the substrate, the p-type impurity may involve using other group III elements such as aluminum (Al), gallium (Ga) and indium (In). Moreover, the n-type impurity may involve using other group V elements such as arsenic (As) and antimony (Sb). Further, in the case of employing a group III-V compound semiconductor for the substrate, a group II element may be used as the p-type impurity, and a group IV element may be employed as the n-type impurity.

In the first embodiment and the second embodiment, the p-type substrate 10 is used as the substrate, and the deep p-well 11 is formed between the p-type substrate 10 and the deep n-well 21 in order to reduce the fluctuation of the voltage of the deep n-well 21. The implementation of the semiconductor device is not limited to this construction. For example, it may not cause any inconvenience to take a configuration with the conductivity types being completely reversed. Namely, the present invention may also be a semiconductor device constructed such that the n-type substrate is used as the substrate, and an NMOS p-well formed in a position distanced from the voltage supply terminal with the n-well being interposed therebetween is connected via the deep p-well to the voltage supply terminal. The present invention can be carried out with respect to this type of semiconductor device in a way that forms the deep n-well between the n-type substrate and the deep p-well in order to reduce the fluctuation of the voltage of the deep p-well.

What is claimed is:

1. A semiconductor device comprising:
   a first conductivity type semiconductor substrate;
   a voltage supply terminal provided on said semiconductor substrate;
   one or more elements including a second conductivity type well portion and disposed on said semiconductor substrate;
   a second conductivity type first conductive layer formed contiguously with said second conductivity type well portion under said one or more elements and connecting said second conductivity type well portion of said one or more elements to said voltage supply terminal;
   a first conductivity type second conductive layer formed contiguously with a lower side of said second conductivity type first conductive layer;
   a first conductivity type third conductive layer formed above said second conductivity type first conductive layer; and
   one or more elements having said first conductivity type third conductive layer formed as a first conductivity type well portion,
   wherein said first conductivity type third conductive layer is formed between said second conductivity type well portion and a connecting position of said voltage supply terminal to said second conductivity type first conductive layer, and
   said second conductivity type first conductive layer connects said voltage supply terminal to said second conductivity type well portion under said first conductivity type third conductive layer.

2. The semiconductor device according to claim 1, wherein a peak position of the impurity concentration distribution for forming said first conductivity type second conductive layer in a direction from an element side toward a lower layer exists lower than a peak position of an impurity concentration distribution of an impurity for forming said second conductivity type first conductive layer.

3. The semiconductor device according to claim 1, wherein a concentration of the impurity for forming said first conductivity type second conductive layer is lower than a concentration of the impurity for forming said second conductivity type first conductive layer.

4. The semiconductor device according to claim 1, wherein said second conductive layer is formed over substantially an entire surface of said semiconductor substrate.

5. A semiconductor system including a semiconductor device and a control device controlling said semiconductor device,
   said semiconductor device comprising:
   a first conductivity type semiconductor substrate;
   a voltage supply terminal provided on said semiconductor substrate;
   one or more elements including a second conductivity type well portion and disposed on said semiconductor substrate;
   a second conductivity type first conductive layer formed contiguously with said second conductivity type well portion under said one or more elements and connecting said second conductivity type well portion of said one or more elements to said voltage supply terminal; and
   a first conductivity type second conductive layer formed contiguously with a lower side of said second conductivity type first conductive layer;
   a first conductivity type third conductive layer formed above said second conductivity type first conductive layer; and
   one or more elements having said first conductivity type third conductive layer formed as a first conductivity type well portion,
   wherein said first conductivity type third conductive layer is formed between said second conductivity type well portion and a connecting position of said voltage supply terminal to said second conductivity type first conductive layer, wherein said second conductivity type first conductive layer connects said voltage supply terminal to said second conductivity type well portion under said first conductivity type third conductive layer, and wherein said control device biases, when said element is in an non-active status, said second conductivity type first conductive layer with a first voltage in a direction opposite to a conductive direction via said voltage supply terminal, and biases, when said element is in an active status, said second conductivity type first conductive layer with a second voltage weaker than the first voltage via said voltage supply terminal.

* * * * *